(12) United States Patent
Nakajima et al.

(10) Patent No.: US 11,267,340 B2
(45) Date of Patent: Mar. 8, 2022

(54) PASSENGER VEHICLE WINDOW GLASS AND WARNING DISPLAY METHOD

(71) Applicant: SEKISUI CHEMICAL CO., LTD., Osaka (JP)

(72) Inventors: Daisuke Nakajima, Takatsuki (JP); Yuusuke Oota, Moriyama (JP); Atsushi Nohara, Kusatsu (JP); Masashi Yanai, Okayama (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 0 days.

(21) Appl. No.: 16/753,028

(22) PCT Filed: Oct. 9, 2018

(86) PCT No.: PCT/JP2018/037626
§ 371 (c)(1),
(2) Date: Apr. 2, 2020

(87) PCT Pub. No.: WO2019/073983
PCT Pub. Date: Apr. 18, 2019

(65) Prior Publication Data
US 2020/0254877 A1    Aug. 13, 2020

(30) Foreign Application Priority Data
Oct. 10, 2017    (JP) .............................. JP2017-197214

(51) Int. Cl.
*B60J 1/20*    (2006.01)
*B60K 35/00*    (2006.01)
*B60J 1/02*    (2006.01)

(52) U.S. Cl.
CPC ................. *B60K 35/00* (2013.01); *B60J 1/02* (2013.01); *B60K 2370/152* (2019.05);
(Continued)

(58) Field of Classification Search
None
See application file for complete search history.

(56) References Cited

U.S. PATENT DOCUMENTS

2014/0002255 A1* 1/2014 Reuschel ............. G02B 6/0095
340/438
2014/0355106 A1  12/2014 Laluet et al.
(Continued)

FOREIGN PATENT DOCUMENTS

FR    2 929 017    9/2009
FR    3 043 025    5/2017
(Continued)

OTHER PUBLICATIONS

International Search Report (ISR) dated Dec. 18, 2018 in International (PCT) Application No. PCT/JP2018/037626.
(Continued)

*Primary Examiner* — Brent Swarthout
(74) *Attorney, Agent, or Firm* — Wenderoth, Lind & Ponack, L.L.P.

(57) ABSTRACT

A windshield (window glass for a vehicle) 10 is a window glass for a vehicle emitting visible light through incident radiation of excitation light that is irradiated from a light source, and an end part 10E of the window glass for a vehicle is capable of emitting light through irradiation with the excitation light. The present invention can provide window glass for a vehicle such as a car that enables a driver to easily check warning display without narrowing the interior space or obstructing the field of view in the vehicle.

14 Claims, 4 Drawing Sheets

(52) U.S. Cl.
CPC .. *B60K 2370/178* (2019.05); *B60K 2370/179* (2019.05); *B60K 2370/33* (2019.05); *B60K 2370/785* (2019.05)

(56) References Cited

U.S. PATENT DOCUMENTS

| | | | |
|---|---|---|---|
| 2016/0085070 A1* | 3/2016 | Seder | B60K 28/066 |
| | | | 359/631 |
| 2017/0069212 A1 | 3/2017 | Miyazawa et al. | |
| 2018/0086028 A1 | 3/2018 | Berard et al. | |
| 2018/0147990 A1* | 5/2018 | Salter | B60Q 9/008 |
| 2018/0194203 A1* | 7/2018 | Salter | B60J 1/20 |
| 2020/0160714 A1* | 5/2020 | Inaba | B60W 30/095 |
| 2020/0231086 A1* | 7/2020 | Nakajima | B60Q 1/268 |

FOREIGN PATENT DOCUMENTS

| | | |
|---|---|---|
| JP | 2000-25488 | 1/2000 |
| JP | 2006-298061 | 11/2006 |
| JP | 2009-145540 | 7/2009 |
| JP | 2011-42308 | 3/2011 |
| JP | 2012-229001 | 11/2012 |
| JP | 2013-159172 | 8/2013 |
| WO | 2015/178303 | 11/2015 |
| WO | 2016/156720 | 10/2016 |

OTHER PUBLICATIONS

Extended European Search Report dated May 18, 2021, in corresponding European Patent Application No. 18865883.5.

* cited by examiner

PASSENGER VEHICLE WINDOW GLASS AND WARNING DISPLAY METHOD

TECHNICAL FIELD

The present invention relates to window glass for a vehicle such as a car, and a warning display method utilizing the window glass for a vehicle.

BACKGROUND ART

Conventionally, jumping out of pedestrians, approach of obstacles, and the like are detected using stereo cameras and other sensors to give various warnings to a driver in order to avoid collision of cars based on the detection results (for example, see PTL 1). Such warnings are generally displayed on an indicator, a side mirror, or the like. Further, a technique to project a speed, warnings, or the like as a virtual image on a windshield using a head-up display, instead of an indicator, has been practically used in cars (for example, see PTL 2).

CITATION LIST

Patent Literature

PTL1: JP H08-023587 B
PTL2: JP 2000-025488 A

SUMMARY OF INVENTION

Technical Problem

However, it is not easy for a driver to check such conventional warnings displayed on an indicator or a side mirror, so that the warnings may possibly be overlooked. Further, also in the case of projecting warnings on a windshield using a head-up display, the warnings need to be displayed without obstructing the driver's view, and therefore there is a problem of difficulty in checking the display of warnings, in similar to the conventional indicator. Further, the head-up display also has a problem that the device size is large, thereby narrowing the interior space of the vehicle.

The present invention has been devised in view of the circumstances described above, and an object thereof is to provide a window glass for a vehicle such as a car that enables a driver to easily check warning display without narrowing the interior space or obstructing the view in the vehicle.

Solution to Problem

As a result of diligent studies, the inventors have found that the aforementioned problems can be solved by allowing the end part of a window glass for a vehicle to emit a visible light through incident radiation of excitation light, thereby accomplishing the present invention below.

That is, the present invention provides [1] to [14] below.

[1] A window glass for a vehicle emitting visible light through incident radiation of excitation light irradiated from a light source, wherein an end part of the window glass for a vehicle is allowed to emit the light through irradiation with the excitation light.

[2] The window glass for a vehicle according to [1], comprising a transparent plate.

[3] The window glass for a vehicle according to [2], wherein the window glass for a vehicle has a multilayer structure comprising a laminate of at least one transparent plate and a resin film, and
the resin film comprises a resin and a fluorescent material emitting visible light through incident radiation of excitation light.

[4] The window glass for a vehicle according to any one of [1] to [3], being any one of windshield and side glass for a car.

[5] The window glass for a vehicle according to any one of [1] to [4], wherein the end part is allowed to emit light when it is detected that at least any one of a person and an object is approaching the vehicle.

[6] The window glass for a vehicle according to [5], wherein the way of light emission is changed depending on the detected contents.

[7] The window glass for a vehicle according to [6], wherein at least one of emission intensity, light emitting area, and light emitting position is changed depending on a distance from an approaching object.

[8] A warning display method utilizing window glass for a vehicle emitting visible light through incident radiation of excitation light irradiated from a light source, wherein an end part of the window glass for a vehicle is allowed to emit the light through irradiation with the excitation light to alert a passenger.

[9] The warning display method according to [8], wherein the window glass for a vehicle comprises a transparent plate.

[10] The warning display method according to [8] or [9], wherein the window glass for a vehicle has a multilayer structure comprising a laminate of at least one transparent plate and a resin film, and
the resin film comprises a resin and a fluorescent material capable of emitting visible light through incident radiation of the excitation light.

[11] The warning display method according to any one of [8] to [10], wherein the window glass for a vehicle is any one of windshield and side glass for a car.

[12] The warning display method according to any one of [8] to [11], wherein the end part is allowed to emit light when it is detected that at least any one of a person and an object is approaching the vehicle.

[13] The warning display method according to [12], comprising changing the way of light emission depending on the detected contents.

[14] The warning display method according to [13], comprising changing at least one of emission intensity, light emitting area, and light emitting position depending on a distance from the approaching object.

Advantageous Effects of Invention

The present invention provides a window glass for a vehicle such as a car that enables a driver to easily check warning display without narrowing the interior space or obstructing the view in the vehicle.

DESCRIPTION OF EMBODIMENTS

The embodiments of a window glass for a vehicle and a warning display method using the window glass for a vehicle of the present invention will be illustrated below by referring to the drawings.

Figure 1:
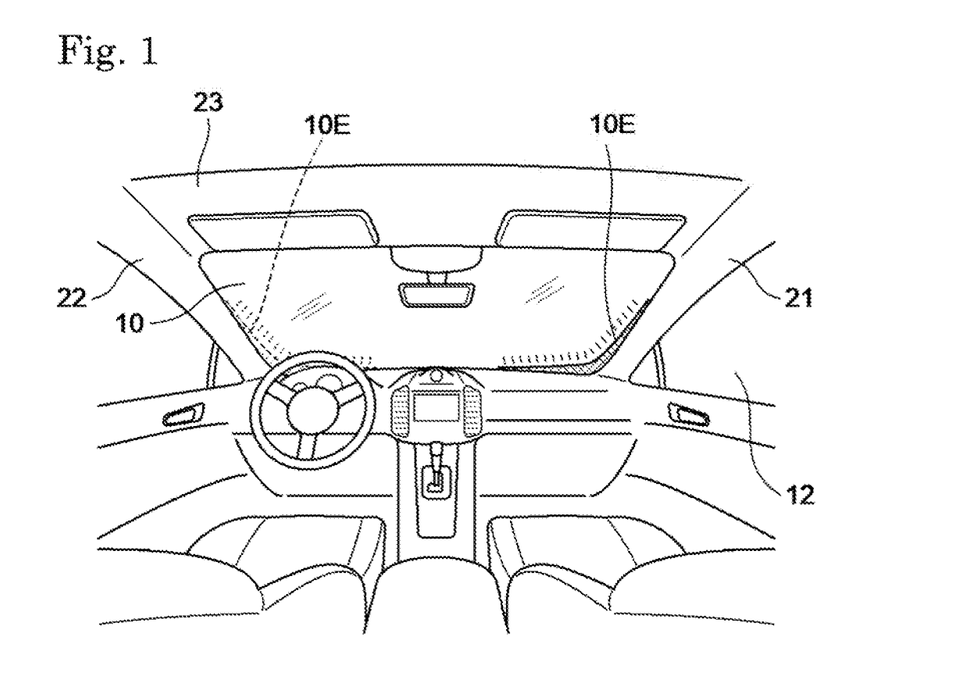
FIG. 1 shows the interior space of a car provided with a window glass for a vehicle according to the first embodiment of the present invention.

FIG. 1 shows the interior space of a car provided with a window glass for a vehicle according to the first embodiment of the present invention. The window glass for a vehicle according to the first embodiment is a car windshield 10. As shown in FIG. 1, the four sides of the windshield 10 are supported by support members provided on pillars 21 and 22 on both sides, a bonnet (not shown), and a roof 23. The windshield 10 can emit visible light through incident radiation of excitation light by containing a fluorescent material or the like, as will be described in detail below.

As shown in FIG. 1, end parts 10E of the windshield 10 is allowed to emit light through incident radiation of excitation light in this embodiment. By allowing the end parts 10E to emit light, warnings to alert a passenger such as the driver of the own car are issued depending on the situation outside the vehicle, as will be described below.

Figure 2:
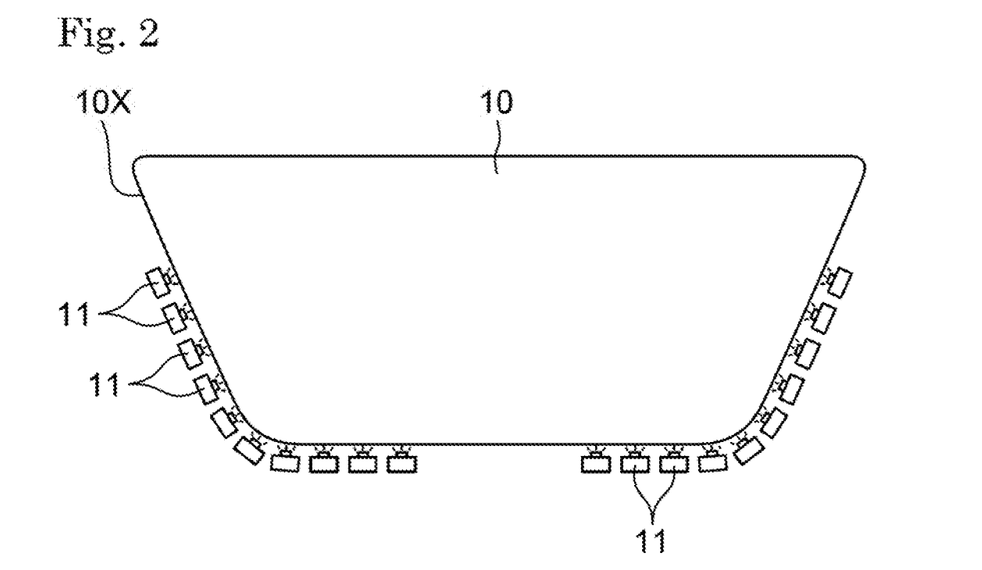
FIG. 2 is a schematic diagram showing the arrangement positions of light sources provided in the periphery of the windshield in the first embodiment.

As shown in FIG. 2, light sources 11 are provided in the periphery of the windshield 10. The light sources 11 are those from which excitation light is irradiated, and laser light sources, LED light sources, xenon lamps, and the like are used therefor. The excitation light irradiated from the light sources 11 needs only to be able to allow the windshield 10 to emit visible light through its incident radiation into the windshield 10.

The maximum emission wavelength of the light irradiated from the light sources 11 is not specifically limited, but is preferably 420 nm or less, more preferably 410 nm or less, further preferably 408 nm or less. Further, it is preferably 300 nm or more, more preferably 350 nm or more, further preferably 380 nm or more.

By adjusting the maximum emission wavelength of the light irradiated from the light sources 11 to such a lower limit or more and such an upper limit or less, the windshield 10 can emit visible light more efficiently by the excitation light from the light sources 11.

The light sources 11 provided in the periphery of the windshield 10 allows excitation light to enter the windshield 10 from outer peripheral surface 10X sides of the windshield 10. A plurality of light sources 11 are provided herein and are provided, for example, inside the bonnet, inside the pillars 21 and 22, and the like. The plurality of light sources 11 are disposed so as to allow the excitation light enter from the outer peripheral surface 10X sides on the outer sides of the end parts 10E of the windshield 10 that emit light. Specifically, as shown in FIG. 2, the plurality of light sources 11 are disposed so as to allow the excitation light enter from the outer peripheral surface 10X sides in the lower right portion and the lower left portion of the windshield 10.

Figure 3:
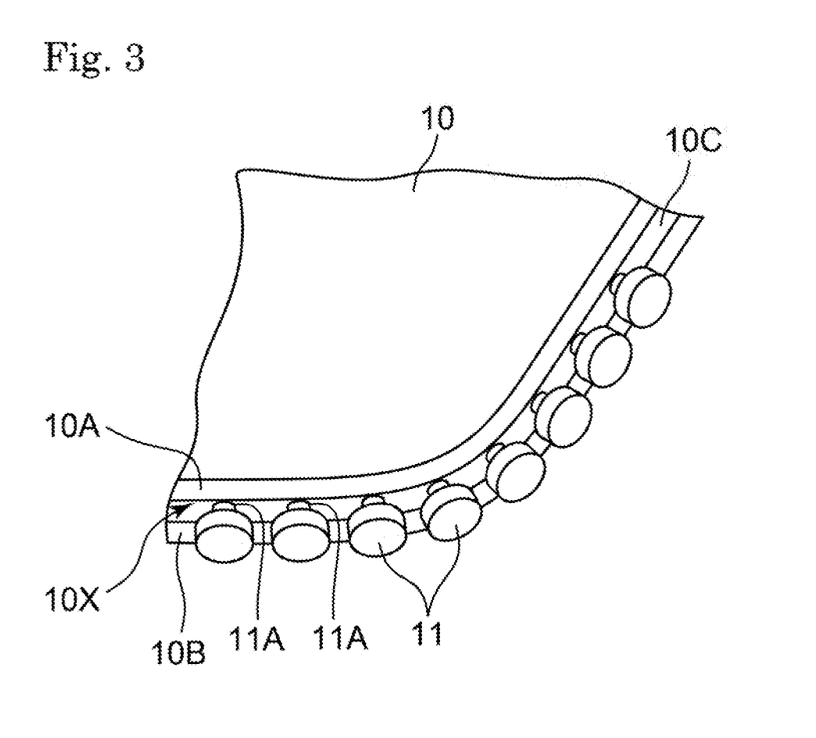
FIG. 3 is a perspective view showing the detail of the windshield according to the first embodiment.

FIG. 3 is a schematic perspective view showing the windshield of this embodiment further in detail. As shown in FIG. 3, the windshield 10 is, for example, laminated glass including two transparent plates 10A and 10B, and an interlayer 10C disposed therebetween, in which the transparent plates 10A and 10B are bonded by the interlayer 10C. In the windshield 10, the interlayer 10C may be composed of a resin film containing a fluorescent material (light emitting layer) or may include two or more resin films at least one of which is resin layer containing a fluorescent material (light emitting layer). However, the windshield 10 is not limited to such a configuration, and any configuration may be employed as long as at least one of its layers is a light emitting layer that emits light, as will be described in detail below.

As shown in FIG. 3, the light sources 11 may be provided so that their output ends 11A are opposed to the outer peripheral surfaces 10X of the windshield 10. Further, the output ends 11A of the light sources 11 are preferably disposed so as to be opposed to or in contact with the light emitting layer of the windshield 10 (in FIG. 3, the interlayer 10C), in order to enhance the light emission efficiency in the windshield 10.

Further, the optical axes of the light sources 11 are normally parallel to the plane direction of the windshield 10, but may be appropriately inclined from the plane direction. Inclination of the optical axes makes it difficult for the excitation light from the light sources 11 to enter the inside, thereby making it easy to allow only the end parts 10E to emit light.

Further, in the case when the interlayer 10C having a light emitting layer is provided between the two transparent plates 10A and 10B, the plurality of light sources 11 may be, for example, composed of LED chips and disposed between the transparent plates 10A and 10B on the outer peripheral surfaces 10X or in the vicinity of the outer peripheral surfaces 10X. In such a case, the light sources 11 may be, for example, attached to the transparent plates 10A and 10B or embedded in the resin film 11C. Further, diffusion lenses or the like may be provided on the output ends 11A of the light sources 11, so that the excitation light from the light sources 11 is diffused and enters the windshield 10.

The excitation light irradiated from the light sources 11 enters from the outer peripheral surface 10X sides so that the light penetrates into the windshield 10 with the amount of light being attenuated. Accordingly, adjusting the amount of light such that the light does not penetrate into the center of vehicle glass 12 makes it possible that only the end parts 10E of the windshield 10 is allowed to emit light so as to display warnings, as shown in FIG. 1.

Here, the end parts of the windshield (vehicle glass) mean regions with a length of 30% or less of the dimension of the glass from the edges of the windshield (window glass for a vehicle). When it exceeds 30%, the light emission may possibly obstruct the view of the driver. Further, the aforementioned length is preferably 15% or less, more preferably 10% or less, for further preventing the obstruction of the driver's view. Further, the aforementioned length is preferably 1% or more, more preferably 3% or more, in order to allow the driver to recognize the light emission of the windshield 10. The edges mean the outermost portions of the exposed portion of the glass surface on the car interior (inside the vehicle) side of the windshield (window glass for a vehicle). Further, the dimension of the glass is the average of the maximum length in the horizontal direction and the maximum length in the vertical direction on the glass surface of the window glass for a vehicle exposed as the car interior side. When the window glass for a vehicle is openable, as in the case of the side glass, which will be described below, the dimension of the glass is the same as the size of the opening that is closed by the window glass on the car interior side, and the edges mean the edges of the opening.

Further, the portion of the windshield 10 (vehicle glass) that emits light means a portion with a brightness of the vehicle glass 12 of 100 $cd/m^2$ or more, as measured at a distance of 35 cm perpendicularly from the light emitting surface using a color and luminance meter ("CS-150" manufactured by KONICA MINOLTA, INC). Accordingly, a site that slightly emits light by irradiation with excitation light is not regarded as a light emitting portion in this description.

In this embodiment, when it is detected that a human or an object (which will be hereinafter referred to as "approaching object") is approaching the car, the end parts 10E of the window glass for a vehicle (the windshield 10) is allowed to emit light to display a warning. The configuration thereof will be described further in detail below by referring to FIG. 4. The object herein is a concept including any object such as animals except for humans.

Figure 4:
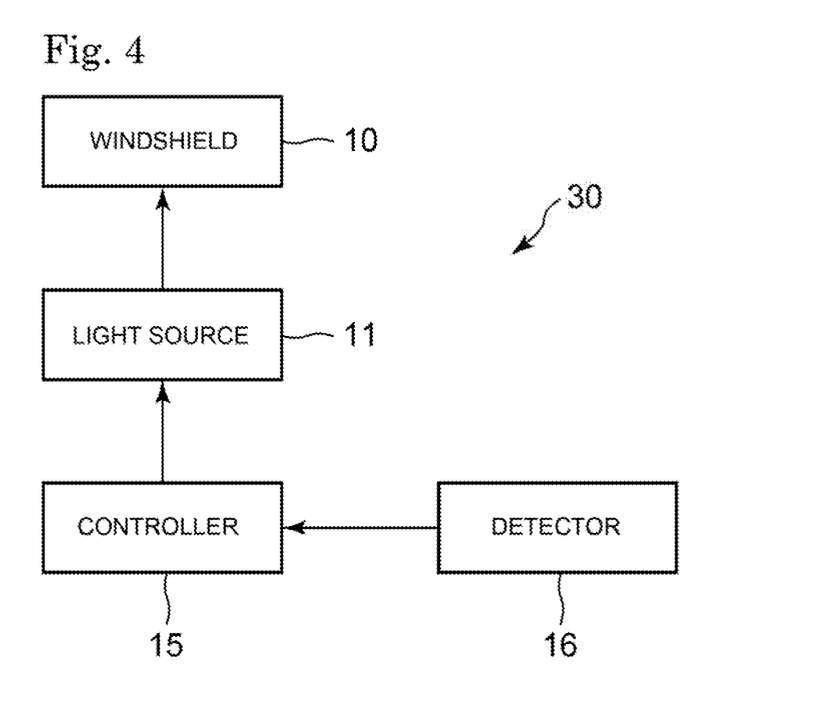
FIG. 4 is a block diagram showing a light emitting system according to the first embodiment.

FIG. 4 illustrates a light emitting system provided in a car in this embodiment. In this embodiment, a light emitting system 30 includes a controller 15 and a detector 16 in addition to the windshield 10 and the light sources 11 described above. The controller 15 controls the entire light emitting system 30 and is constituted by CPU and the like to be provided in a car, but there is no specific limitation.

The detector 16 is a device for grasping the situation outside a car and detects, when an approaching object is approaching the car, the distance, the direction, and the like of the approaching object.

Specifically, the detector 16 is a human sensor, a stereo camera, an objective sensor, and the like provided in a car. The human sensor is a sensor configured to detect that a human is approaching the car. The objective sensor is a sensor configured to detect that a movable body is approaching the car. Further, the stereo camera detects that a human, an object, or the like is approaching the car by analyzing images capturing the outside of the car.

When the detector 16 detects that an approaching object is approaching the car, the detection information is sent to the controller 15. The detection information includes information on the direction of the approaching object, the distance between the approaching object and the own car, and the like. The controller 15 controls the light sources 11 based on the detection information. Specifically, when it is detected that the distance from the approaching object is a prescribed value or less, the light sources 11 are turned on and excitation light enters the windshield 10, thereby allowing the end parts 10E of the windshield 10 to emit light. The light emission of the end parts 10E of the windshield 10 is recognized as warning display by the driver.

Here, the position of the windshield 10 where the light is emitted may be changed depending on the direction or the like of the approaching object. Specifically, in the case when the approaching object is approaching from the right side of the own car, the end part 10E on the right side of the windshield 10, more specifically, the end part 10E on the lower right thereof may be allowed to emit light, as shown in FIG. 1. Meanwhile, in the case when the approaching object is approaching from the left side of the own car, the end part 10E on the left side of the windshield 10, more specifically, the end part 10E on the lower left thereof may be allowed to emit light. In this way, the end part 10E in the same direction as the approaching object is allowed to emit light in this embodiment, so that the driver can instantaneously recognize the direction of the approaching object, thereby making it easy to avoid collision with the approaching object.

Further, when it is detected that the approaching object is approaching the car, the mode of light emission can be changed depending on the detected contents such as the distance and the direction in this embodiment. For example, at least one of the emission intensity, the light emitting area, and the light emitting position may be changed depending on the distance from the approaching object. Specifically, as the distance from the approaching object decreases, at least one of the emission intensity and the light emitting area at the end parts 10E of the windshield 10 may be increased by increasing the intensity of the excitation light emitted from the light sources 11 or the number of light sources 11 that emits the excitation light. Concerning the light emitting area, the portion that emits light may expand, for example, toward the center as the distance from the approaching object decreases. Further, while the light emitting area remains the same, the portion that emits light may move toward the center, as the distance from the approaching object decreases. The portion that emits light easily gets into the driver's view by the portion that emits light expanding toward the center or moving toward the center, so that the driver can visually recognize high danger.

Further, the configuration may be, for example, such that the emission intensity is set to be the same at multiple points, in the case when the approaching object is far, whereas the emission intensity is set to be relatively high at positions close to the center while the emission intensity is set to be relatively low at positions away from the center, in the case when the approaching object is close. According to such a mode, in the case when the approaching object is close, the light emission has a gradation, thereby making it easy for the driver to visually recognize high danger.

As described above, in this embodiment, the end parts of the windshield is allowed to emit light through irradiation of excitation light, thereby enabling warnings that can be easily checked by the driver to be displayed by light emission without obstructing the driver's view. Further, since light is emitted by using the window glass, warnings can be displayed with little or no narrowing the interior space of the car. Further, it is made easy for the driver to visually recognize warning contents and the like by appropriately changing the emission intensity, the light emitting area, the light emitting position, and the like depending on the distance and the direction of the approaching object.

Figure 5:
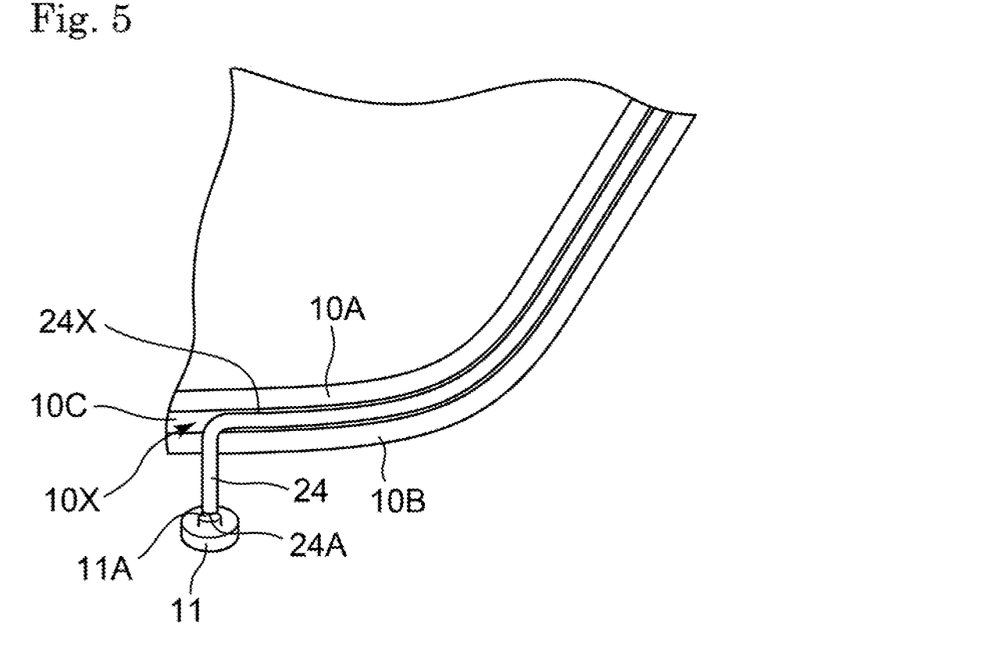
FIG. 5 is a perspective view showing the detail of the windshield according to the second embodiment of the present invention.

FIG. 5 is a schematic perspective view showing a window glass for a vehicle according to the second embodiment of the present invention. Only the difference of the second embodiment from the first embodiment will be described below.

In the second embodiment, a light guide 24 is further provided in the car. As shown in FIG. 5, the light guide 24 is, for example, disposed to extend along an outer peripheral surface 10X of the windshield 10. The light guide 24 is provided so as to have an end part 24A opposed to an output end 11A of a light source 11, and excitation light emitted from the light source 11 enters the end part 24A. The light source 11 is provided inside the bonnet, inside the pillars 21 and 22, or the like, in the same manner as in the first embodiment.

The light guide 24 needs only to be able to radiate the excitation light that has entered the end part 24A from a side surface 24X of the light guide 24. Specifically, side emission type optical fibers may be used. Examples of the side emission type optical fibers include core-clad optical fibers with light scatterers or the like dispersed therein. The light radiated from the side surface 24X of the light guide 24 enters the inside of the windshield 10 through the outer peripheral surface 10X of the windshield 10. The windshield 10 emits visible light through the excitation light incident thereon.

Since the portion of the side surface 24X of the light guide 24 that is not opposed to the windshield 10 is not required to radiate the excitation light, a film that absorbs or reflects excitation light may be formed. Specifically, a film containing an ultraviolet absorber or the like may be formed.

As shown in FIG. 5, the light guide 24 may be configured so that the side surface 24X is opposed to or in contact with the light emitting layer of the windshield 10 (in FIG. 5, the interlayer 10C), for enhancing the incidence efficiency of excitation light on the windshield 10. Further, in the case when the interlayer 10C provided between the two transparent plates 10A and 10B has a resin film composed of a light emitting layer, the light guide 24 may be disposed between the two transparent plates 10A and 10B on the outer peripheral surface 10X or in the vicinity of the outer peripheral surface 10X. In such a case, the light guide 24 may be disposed, for example, so as to be embedded in the interlayer 10C.

The arrangement position of the light guide 24 may be determined depending on the light emitting position of the windshield. That is, as shown in FIG. 1, when the end part 10E on the lower right and the end part 10E on the lower left are allowed to emit light, the light guide 24 may be disposed along the outer peripheral surface 10X on each of the lower right and the lower left of the windshield 10.

At least one light guide 24 may be provided, but a plurality of light guides 24 may be provided on the outer peripheral surface 10X at different positions in the peripheral direction of the windshield 10, so that the light emitting position and the light emitting area can be changed, or the emission intensity can be changed depending on the light emitting position, in the same manner as in the first embodiment.

According to the aforementioned configuration, warnings can be displayed by light emission of the end parts of the windshield with little or no narrowing the interior space of the car also in this embodiment, in the same manner as in the first embodiment. Further, when it is detected that the approaching object is approaching the car, the mode of light emission can be changed depending on the detected contents such as the distance and the direction thereof also in the second embodiment, in the same manner as in the first embodiment. For example, at least one of the emission intensity, the light emitting area, and the light emitting position is appropriately changed depending on the distance and the direction of the approaching object, or the like, thereby making it easy for the driver to visually recognize the warning contents.

Figure 6:
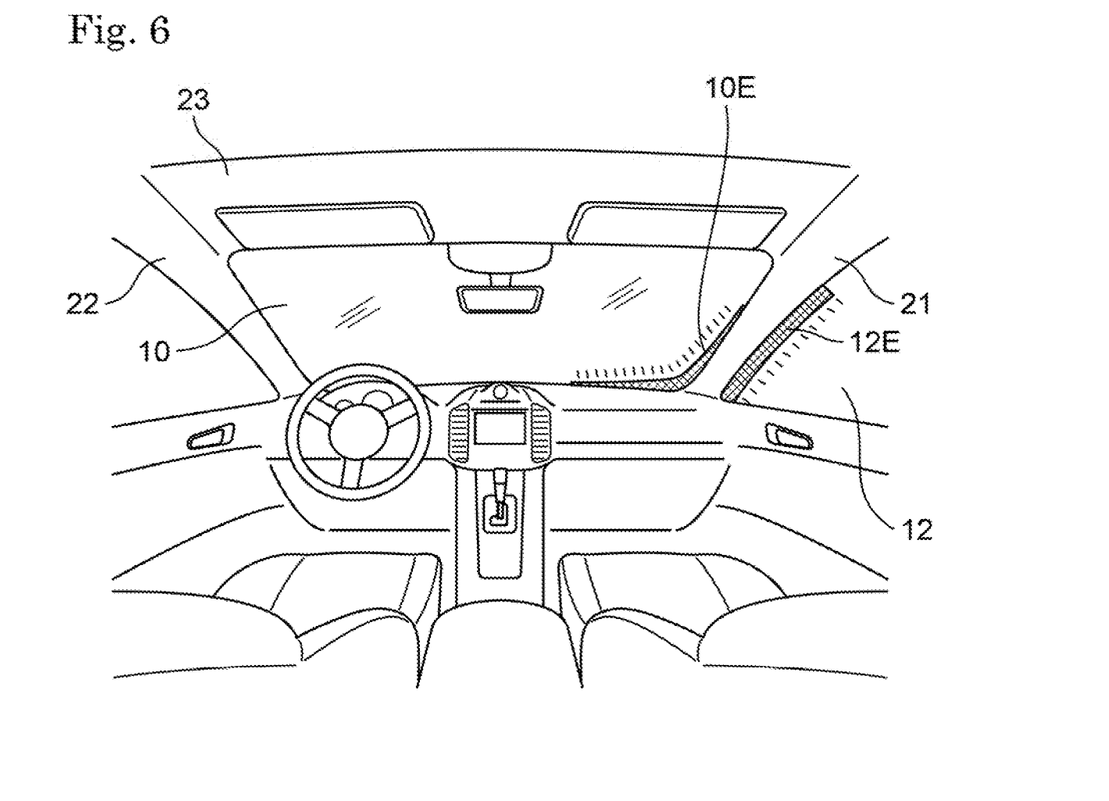
FIG. 6 shows the interior space of a car provided with a window glass for a vehicle according to the third embodiment of the present invention.

FIG. 6 is a schematic view showing the third embodiment of the present invention. The window glass for a vehicle that emits light is the windshield 10 in the first and second embodiments, but is the windshield 10 and front side glass 12 in the third embodiment.

That is, in this embodiment, the light source 11 or the light guide 24 is provided in the periphery of the front side glass 12, in the same manner as in the windshield 10 described above, so that an end part 12E of the front side glass 12 can also emit light. Here, the end part 12E of the front side glass 12 that is allowed to emit light may be the end part on the front side, as shown in FIG. 6, but may be the end part on the lower side or that on the upper side. Further, it may be a combination of two or more of these end parts.

In this embodiment, the front side glass 12 is also allowed to emit light in addition to the windshield 10, thereby enabling the light emission patterns of the warning display to be richer in variety. For example, when the distance from the approaching object is relatively large, the end part 12E of the front side glass 12 may be allowed to emit light, whereas when the distance is relatively small, the end part 10E of the windshield 10, or both of the end parts 10E and 12E of the windshield 10 and the front side glass 12 may be allowed to emit light.

More specifically, for example, when an approaching object is approaching from the right side, while the distance is large, only the end part 12E of the front side glass 12 on the right side may be allowed to emit light, and when the distance from the approaching object has decreased, the end part 10E on the right side of the windshield 10, or both of the end part 10E on the right side of the windshield 10 and the end part 12E of the front side glass 12 on the right side may be allowed to emit light. Also when the approaching object is approaching from the left side, the end part 10E on the left side of the windshield 10, the end part 12E of the front side glass 12 on the left side, or the like may be allowed to emit light.

According to another mode, for example, when the approaching object is present on the backward or side, the end part 12E of the front side glass 12 may be allowed to emit light, and when the approaching object is present in front, the end part 10E of the windshield 10 may be allowed to emit light. Also in this case, when the approaching object is present on the right side, the end part 10E on the right side of the windshield 10 or the end part 12E of the front side glass 12 on the right side may be allowed to emit light. Also when the approaching object is present on the left side, the end part 10E on the left side of the windshield 10, the end part 12E of the front side glass 12 on the left side, or the like may be allowed to emit light.

Further, in the same manner as in the first embodiment, when it is detected that the approaching object is approaching the car, the way of light emission can be changed depending on the detected contents such as the distance and the direction thereof. For example, at least one of the emission intensity, the light emitting area, and the light emitting position in the windshield 10 and the front side glass 12 may be appropriately changed depending on the distance from the approaching object.

Also in this embodiment, any one of the light source and the light guide may be disposed in the periphery of the front side glass 12, so that the excitation light is incident on the outer peripheral surface side of the front side glass 12, for example, in the same manner as in the windshield 10.

Figure 7:
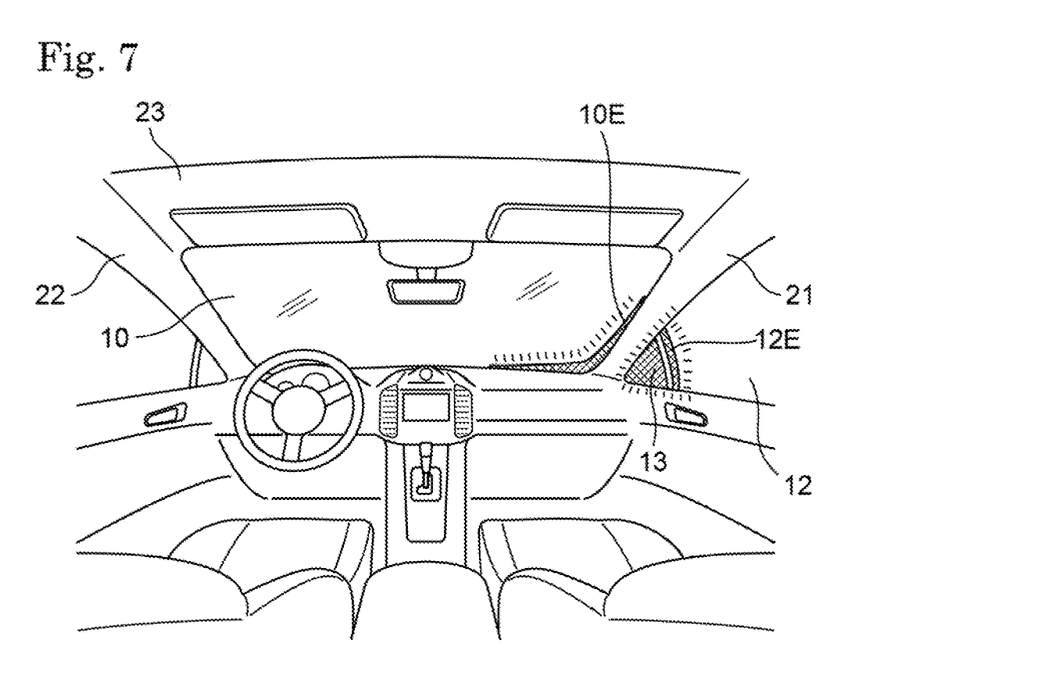
FIG. 7 shows the interior space of a car provided with a window glass for a vehicle according to the fourth embodiment of the present invention.

FIG. 7 is a schematic view showing the fourth embodiment of the present invention. In the fourth embodiment, delta window glass 13 can emit light in addition to the windshield 10 and the front side glass 12. The delta window glass 13 is a window that exists further in front of the front side glass 12 in a side part of the car and is generally a glass window that is not openable.

In this embodiment, as in the windshield 10 and the front side glass 12 of the first to third embodiments, the light source or the light guide is provided also in the periphery of the delta window glass 13. The delta window glass 13 emits light through excitation light incident thereon from the outer peripheral surface side. Since the delta window glass 13 is generally a small window, the driver cannot be sufficiently alerted even if only the end part thereof is allowed to emit light. Therefore, portions other than the end part of the delta window glass 13 in addition to the end part may be allowed to emit light, or the whole may be allowed to emit light.

In this embodiment, the delta window glass 13 can emit light in addition to the windshield 10 and the front side glass 12, thereby enabling the light emission patterns of the warning display to be richer in variety.

For example, when the distance is relatively large, the end part 12E of the front side glass 12 may be allowed to emit light, and when the distance is moderate, the delta window glass 13, or the end part 12E of the front side glass 12 and the delta window glass 13 may be allowed to emit light. Further, when the distance is relatively small, the end part 10E of the windshield 10, or the end part 10E of the windshield 10 and at least one of the end part 12E of the front side glass and the delta window glass 13 may be allowed to emit light.

Further, according to another mode, for example, when the approaching object is present in the back, the end part 12E of the front side glass 12 may be allowed to emit light. Meanwhile, when the approaching object is present on a sideways, the delta window 13 may be allowed to emit light, and when the approaching object is present in front, the end part 10E of the windshield 10 may be allowed to emit light. Also in this mode, in the case when the approaching object is present on the right side, the end part 10E on the lower right of the windshield 10, the end part 12E of the front side glass 12 on the right side, and the delta window 13 on the right side may be allowed to emit light. The similar mode applies to the case when the approaching object is present on the left side.

Further, when it is detected that the approaching object is approaching the car, the mode of light emission can be changed depending on the detected contents such as the distance and the direction thereof, as in the aforementioned embodiments. For example, at least one of the emission intensity, the light emitting area, and the light emitting position in the windshield 10, the delta window glass 13, and the front side glass 12 may be changed depending on the distance from the approaching object.

Figure 8:
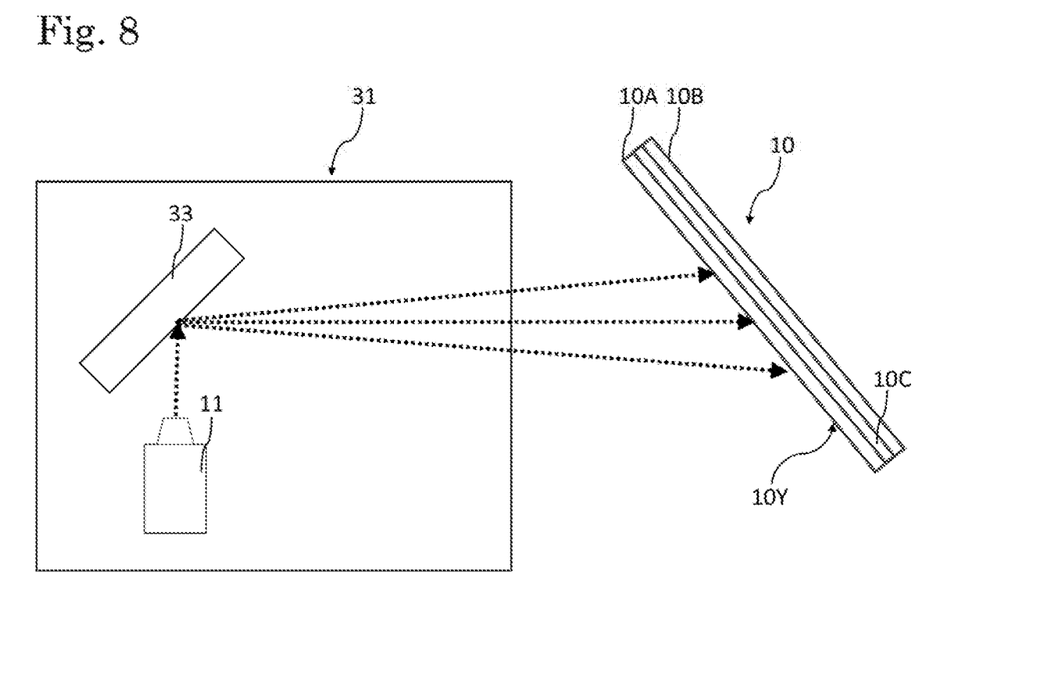
FIG. 8 is a schematic diagram showing the overview of a light emitting system according to the fifth embodiment of the present invention.

Next, the fifth embodiment of the present invention will be described by referring to FIG. 8. In the first to the fourth embodiments described above, modes in which the window glass for a vehicle such as the windshield emits light through the excitation light incident thereon from the outer peripheral surface side have been shown, but the window glass for a vehicle such as the windshield is allowed to emit light by the excitation light that is incident from the surface on the car interior side in this embodiment. The difference of the fifth embodiment from the aforementioned embodiments will be described below.

In this embodiment, a light source unit 31 including a MEMS (Micro Electro Mechanical Systems) mirror 33 in addition to the light source 11 from which the excitation light is irradiated is used. The light source unit 31 is not specifically limited, as long as it is located at a position where each window glass for a vehicle can be irradiated with the excitation light inside a car. For example, in the case when the windshield 10 emits light, it may be provided on the dashboard or on the front side of the roof. Further, in the case when the front side glass 12 or the delta window glass is allowed to emit light, it may be provided, for example, on the inner surface of the door body of the front side door.

The MEMS mirror 33 is, for example, swingable about two axes and irradiates the surface on the car interior side of the vehicle glass (in FIG. 8, a surface 10Y of the windshield 10) with the light from the light source 11 by scanning. In such a case, the window glass for a vehicle is irradiated with the excitation light from the light source 11 as scanning light via the MEMS mirror 33 the drive of which is controlled. In this embodiment, a desired portion of the vehicle glass can be allowed to emit light by appropriately controlling the MEMS mirror 33. Accordingly, the end parts 10E and 12E of the windshield 10 and the front side glass 12 can be allowed to emit light also in this embodiment, in the same manner as in the aforementioned embodiments. Further, since the MEMS mirror is generally small, use of the MEMS mirror enables the end parts of the window glass to emit light with little or no narrowing the interior space of the car.

Any light source unit other than the light source unit with the MEMS mirror 33 may be used as the light source unit in this embodiment, as long as it can irradiate the surface of the window glass for a vehicle with the excitation light. Examples of such a light source unit may include a light source unit that emits scanning light other than the light source unit with the MEMS mirror 33. Since such a light source unit that emits scanning light is generally small, the light source unit enables the window glass to emit light for display without occupying a large space inside the car, in similar to the light source unit with the MEMS mirror.

Further, the light source unit may be a light source unit capable of irradiating the window glass for a vehicle with the excitation light as beam light. The beam light irradiates all portions of the window glass that emit light at the same timing, and no scanning shift or the like occurs as in the case of using scanning light. Examples of the light source unit other than the light source unit with the MEMS mirror include those utilizing the DMD (Digital Micromirror Device) method using DLP (Digital Light Processing), LCOS (Liquid crystal on silicon), or the like.

In the description above, the embodiments in which the end parts 10E of the windshield 10, or both of the end parts 10E and 12E of the windshield 10 and the side glass 12 emit light are shown, but there is no limitation to the aforementioned configurations as long as one or more pieces of car window glass emit light. For example, a configuration in which an end part of rear glass emits light may be employed, or a configuration in which an end part of any one of side glass emits light may be employed. Further, in the description above, the side glass has a configuration in which the end part 12E of the front side glass 12 emits light, but a configuration in which the end part of the rear side glass emits light may, of course, be employed.

Further, the aforementioned embodiments describe a configuration in which the end parts 10E on the lower left and on the lower right of the windshield are allowed to emit light in the case when the windshield 10 is allowed to emit light; however, any one of the end parts of the windshield 10 may be allowed to emit light, for example, the lower end part may be allowed to emit light, or both side ends may be allowed to emit light. Further, the upper end part or the end part on the upper left or on the upper right may be allowed to emit light, or two or more of such positions may be allowed to emit light.

Further, the aforementioned first to fourth embodiments describe a mode in which the window glass for a vehicle emits light through the excitation light incident thereon from the outer peripheral surface side, while the fifth embodiment describes a mode in which it emits light through the excitation incident thereon from the surface on the car interior side. These may be used in combination. For example, the windshield may emit light through the excitation light incident thereon from the surface of the car interior side, while the side glass may emit light through the excitation light incident thereon from the outer peripheral surface side of the glass.

Further, in the aforementioned embodiments, the vehicle glass is used as the window glass for a car, but may be used as window glass for other vehicles. Examples of such vehicles include various vehicles including railway vehicles such as electric trains, steam-locomotive pulled trains, and trains, forklifts, heavy machineries for civil engineering such as excavators, carts, and amusement park vehicles. Further, it may be employed in ships, airplanes, and the like other than the aforementioned vehicles. However, in any vehicle, the vehicle glass of the present invention is preferably used as window glass that is in the view of the driver while driving.

[Structure of Window Glass for a Vehicle]

Next, the structure of the window glass for a vehicle used in the present invention will be described further in detail. The window glass for a vehicle used in the present invention may be composed of a single layer or may have a multilayer structure having two or more layers. Further, in the window glass for a vehicle, it is preferable that at least one layer is a transparent plate. The transparent plate may be composed of any one of inorganic glass and organic glass. The organic glass is so-called resin glass. The window glass for a vehicle having a multilayer structure may include one transparent plate or may include two or more transparent plates. Further, in the window glass for a vehicle, such a transparent plate may contain a fluorescent material and serve as a light emitting layer that emits light through excitation light incident thereon, or a layer other than the transparent plate may contain a fluorescent material and serve as a light emitting layer.

Further, the window glass for a vehicle preferably has a multilayer structure comprising a laminate of at least one transparent plate and a resin film, and it is more preferable that the resin film contains a resin and a fluorescent material to serve as a light emitting layer in the multilayer structure.

Further, the light emitting layer is not limited to the resin film and the transparent plate mentioned above and may be a fluorescent material coating formed by vacuum vapor deposition, sputtering, or the like of a fluorescent material. The fluorescent material coating may be formed, for example, on at least one surface of the transparent plate.

(Fluorescent Material)

The fluorescent material emits visible light through incident radiation of excitation light, more specifically, absorbs the excitation light irradiated from the aforementioned light source to emit visible light having a wavelength longer than that of the excitation light. Further, the fluorescent material may be a material that emits so-called phosphorescence by irradiation with the excitation light.

Specifically, examples of the aforementioned fluorescent material include a lanthanoid complex having a ligand containing a halogen atom since it can exert high luminescence. Among lanthanoid complexes, the lanthanoid complex having a ligand containing a halogen atom emits light with high emission intensity by irradiation with light rays. Examples of the lanthanoid complex having a ligand containing a halogen atom include a lanthanoid complex having a monodentate ligand containing a halogen atom and a lanthanoid complex having a multidentate ligand containing a halogen atom, such as a lanthanoid complex having a bidentate ligand containing a halogen atom, a lanthanoid complex having a tridentate ligand containing a halogen atom, a lanthanoid complex having a tetradentate ligand containing a halogen atom, a lanthanoid complex having a pentadentate ligand containing a halogen atom, and a lanthanoid complex having a hexadentate ligand containing a halogen atom.

Among these, the lanthanoid complex having a bidentate ligand containing a halogen atom or the lanthanoid complex having a tridentate ligand containing a halogen atom can emit visible light with high emission intensity by irradiation with light at a wavelength of 300 to 410 nm.

Further, the lanthanoid complex having a bidentate ligand containing a halogen atom or the lanthanoid complex having a tridentate ligand containing a halogen atom also has excellent heat resistance. Since window glass for a vehicle is often used under high-temperature condition due to irradiation with infrared rays of sunlight, use of the lanthanoid complex having a bidentate ligand containing a halogen atom or the lanthanoid complex having a tridentate ligand containing a halogen atom can prevent deterioration of the fluorescent material.

In this description, the lanthanoid includes lanthanum, cerium, praseodymium, neodymium, promethium, samarium, europium, gadolinium, terbium, dysprosium, holmium, erbium, thulium, ytterbium, or lutetium. For obtaining still higher emission intensity, the lanthanoid is preferably neodymium, europium, or terbium, more preferably europium or terbium, further preferably europium.

Examples of the bidentate ligand containing a halogen atom include a ligand having a structure represented by formula (1) below and a ligand having a structure represented by formula (2) below.

(1)

In formula (1) above, $R^1$ and $R^3$ each represent an organic group, at least one of $R^1$ and $R^3$ is an organic group containing a halogen atom, and $R^2$ represents a linear organic group having one or more carbon atoms. $R^1$ and $R^3$ above are each preferably a hydrocarbon group, more preferably a hydrocarbon group having 1 to 10 carbon atoms, further preferably a hydrocarbon group having 1 to 5 carbon atoms, particularly preferably a hydrocarbon group having 1 to 3 carbon atoms. The hydrogen atoms in the aforementioned hydrocarbon group may be partially replaced by atoms other than hydrogen atoms and functional groups. Examples of the hydrocarbon group having 1 to 3 carbon atoms include a methyl group, an ethyl group, and a propyl group, with no hydrogen atoms replaced, and a methyl group, an ethyl group, and a propyl group, with the hydrogen atoms partially replaced by halogen atoms. Fluorine atoms, chlorine atoms, bromine atoms, and iodine atoms can be used as the halogen atoms that partially replace the hydrogen atoms of the methyl group, the ethyl group, and the propyl group. As the hydrocarbon group having 1 to 3 carbon atoms, a methyl group, an ethyl group, and a propyl group, with the hydrogen atoms partially replaced by halogen atoms are preferable, and trifluoromethyl groups are more preferable, since they emit light with high emission intensity.

$R^2$ above is preferably an alkylene group having one or more carbon atoms, more preferably an alkylene group having 1 to 5 carbon atoms, most preferably a methylene group having one carbon atom. The alkylene group having one or more carbon atoms may have hydrogen atoms partially replaced by atoms other than the hydrogen atoms and functional groups.

The lanthanoid complex having a ligand containing a halogen atom may have at least one ligand containing a halogen atom and may have a ligand containing no halogen atoms. Examples of the ligand containing no halogen atoms include a ligand that is the same as the ligand of formula (1) above except for containing no halogen atoms, and a ligand having a structure represented by formula (2) to (8) below. The ligand having a structure represented by formula (2) to (8) below may have hydrogen atoms partially or entirely replaced by —COOR, —SO$_3$, —NO$_2$, —OH, an alkyl group, —NH$_2$, and the like.

(2)

In formula (2) above, two Ns may be located at any positions in the bipyridine skeleton. For example, the two Ns are located at the 2- and 2'-positions, the 3- and 3'-positions, the 4- and 4'-positions, the 2- and 3'-positions, the 2- and 4'-positions, or the 3- and 4'-positions in the bipyridine skeleton. Among these, the two Ns are preferably located at the 2- and 2'-positions.

(3)

In formula (3) above, the two Ns may be located at any positions in the bipyridine skeleton. Among these, the two Ns are preferably located at the 1- and 10-positions.

(4)

In formula (4) above, the two Ns may be located at any positions in the bipyridine skeleton. Among these, the two Ns are preferably located at the 1- and 10-positions.

(5)

In formula (5) above, the three Ns may be located at any positions in the terpyridine skeleton.

(6)

In formula (6) above, R$^4$ positioned at the center represents a linear organic group having one or more carbon atoms.

(7)

In formula (7) above, two R$^5$s each represent a linear organic group having one or more carbon atoms.

(8)

In formula (8) above, n represents an integer of 1 or 2.

Examples of the lanthanoid complex having a bidentate ligand containing a halogen atom include tris(trifluoroacetylacetone)phenanthroline europium (Eu(TFA)$_3$phen), tris(trifluoroacetylacetone)diphenylphenanthroline europium (Eu(TFA)$_3$dpphen), tris(hexafluoroacetylacetone) diphenylphenanthroline europium, tris(hexafluoroacetylacetone) bis(triphenylphosphine) europium, tris(trifluoroacetylacetone)2,2'-bipyridine europium, tris(hexafluoroacetylacetone)2,2'-bipyridine europium, tris(5,5,6,6,7,7,7-heptafluoro-2,4-pentanedionate)2,2'-bipyridine europium ([Eu(FPD)$_3$]bpy), tris(trifluoroacetylacetone)3,4,7,8-tetramethyl-1,10-phenanthroline europium ([Eu(TFA)$_3$]tmphen), tris(5,5,6,6,7,7,7-heptafluoro-2,4-pentanedionate)phenanthroline europium ([Eu(FPD)$_3$]phen), terpyridine trifluoroacetylacetone europium, and terpyridine hexafluoroacetylacetone europium.

Examples of the lanthanoid complex having a bidentate ligand containing a halogen atom additionally include tris(trifluoroacetylacetone)phenanthroline terbium (Tb(TFA)$_3$phen), tris(trifluoroacetylacetone)diphenylphenanthroline terbium (Tb(TFA)$_3$dpphen), tris(hexafluoroacetylacetone) diphenylphenanthroline terbium, tris(hexafluoroacetylacetone)bis(triphenylphosphine) terbium, tris(trifluoroacetylacetone)2,2'-bipyridine terbium, tris(hexafluoroacetylacetone)2,2'-bipyridine terbium, tris(5,5,6,6,7,7,7-heptafluoro-2,4-pentanedionate)2,2'-bipyridine terbium ([Tb(FPD)$_3$]bpy), tris(trifluoroacetylacetone)3,4,7,8-tetramethyl-1,10-phenanthroline terbium ([Tb(TFA)$_3$]tmphen), tris(5,5,6,6,7,7,7-heptafluoro-2,4-pentanedionate) phenanthroline terbium ([Tb(FPD)$_3$]phen), terpyridine trifluoroacetylacetone terbium, and terpyridine hexafluoroacetylacetone terbium.

As the halogen atom contained in the ligand of the lanthanoid complex, a fluorine atom, a chlorine atom, a bromine atom, or an iodine atom can be used. Among these, a fluorine atom is suitable for stabilizing the structure of the ligand.

Among the lanthanoid complex having a bidentate ligand containing a halogen atom or the lanthanoid complex having a tridentate ligand containing a halogen atom, a lanthanoid complex having a bidentate ligand containing a halogen atom and having an acetylacetone skeleton is particularly suitable due to its excellent initial luminescence.

Examples of the lanthanoid complex having a bidentate ligand containing a halogen atom and having an acetylacetone skeleton include Eu(TFA)$_3$phen, Eu(TFA)$_3$dpphen, Eu(HFA)$_3$phen, [Eu(FPD)$_3$]bpy, [Eu(TFA)$_3$]tmphen, and [Eu(FPD)$_3$]phen. The structures of such a lanthanoid complex having a bidentate ligand containing a halogen atom and having an acetylacetone skeleton are shown below.

Eu(TFA)$_3$phen

[Eu(FPD)$_3$]bpy

Eu(TFA)$_3$dpphen

[Eu(TFA)$_3$]tmphen

Eu(HFA)$_3$phen

[Eu(FPD)$_3$]phen

Examples of the lanthanoid complex having a bidentate ligand containing a halogen atom and having an acetylacetone skeleton additionally include Tb(TFA)$_3$phen, Tb(TFA)$_3$dpphen, Tb(HFA)$_3$phen, [Tb(FPD)$_3$]bpy, [Tb(TFA)$_3$]tmphen, and [Tb(FPD)$_3$]phen.

The lanthanoid complex having a ligand containing a halogen atom is preferably particulate. The particulate form makes it easier to finely disperse the lanthanoid complex having a ligand containing a halogen atom in the light emitting layer.

When the lanthanoid complex having a ligand containing a halogen atom is particulate, the lower limit of the average particle size of the lanthanoid complex is preferably 0.01 μm, and the upper limit thereof is preferably 10 μm. The lower limit is more preferably 0.03 μm, and the upper limit thereof is more preferably 1 μm.

As the aforementioned fluorescent material, a fluorescent material having a terephthalic acid ester structure can be also used. The fluorescent material having a terephthalic acid ester structure emits light by irradiation with light rays.

Examples of the fluorescent material having a terephthalic acid ester structure include a compound having a structure represented by formula (9) below and a compound having a structure represented by formula (10) below. One of these may be used singly, or two or more of these may be used.

(9)

(10)

In formula (9) above, $R^6$ represents an organic group, and x is 1, 2, 3, or 4.

For further enhancing the visible light transmittance of the window glass for a vehicle, x is preferably 1 or 2, more preferably has a hydroxyl group at the 2- or 5-position of the benzene ring, and further preferably has hydroxyl groups at the 2- and 5-positions of the benzene ring.

The organic group of $R^6$ is preferably a hydrocarbon group, more preferably a hydrocarbon group having 1 to 10 carbon atoms, further preferably a hydrocarbon group having 1 to 5 carbon atoms, particularly preferably a hydrocarbon group having 1 to 3 carbon atoms. When the hydrocarbon group has 10 or less carbon atoms, the fluorescent material having a terephthalic acid ester structure can be easily dispersed in the light emitting layer. The hydrocarbon group is preferably an alkyl group.

Examples of the compound having a structure represented by formula (9) above include diethyl-2,5-dihydroxyterephthalate and dimethyl-2,5-dihydroxyterephthalate. Among these, the compound having a structure represented by formula (9) above is preferably diethyl-2,5-dihydroxyl terephthalate ("diethyl 2,5-dihydroxyterephthalate" available from Aldrich).

In formula (10) above, $R^7$ represents an organic group, $R^8$ and $R^9$ each represent a hydrogen atom or an organic group, and y is 1, 2, 3, or 4.

The organic group of $R^7$ is preferably a hydrocarbon group, more preferably a hydrocarbon group having 1 to 10 carbon atoms, further preferably a hydrocarbon group having 1 to 5 carbon atoms, particularly preferably a hydrocarbon group having 1 to 3 carbon atoms. When the number of carbon atoms in the hydrocarbon group is equal to or less than the upper limit, the fluorescent material having a terephthalic acid ester structure can be easily dispersed in the light emitting layer. The hydrocarbon group is preferably an alkyl group.

In formula (10) above, $NR^8R^9$ is an amino group. $R^8$ and $R^9$ are each preferably a hydrogen atom. Of the hydrogen atoms on the benzene ring of the compound having a structure represented by formula (10) above, one hydrogen atom may be replaced with the aforementioned amino group, two hydrogen atoms may be replaced with each the aforementioned amino group, three hydrogen atoms may be replaced with each the aforementioned amino group, and four hydrogen atoms may be replaced with each the aforementioned amino group.

The compound having a structure represented by formula (10) above is preferably diethyl-2,5-diaminoterephthalate (for example, available from Aldrich).

(Resin Film)

As described above, a resin film serving as the light emitting layer is preferably provided in the window glass for a vehicle. Further, the window glass for a vehicle preferably has a laminated glass structure in which an interlayer is provided between two transparent plates, and the two transparent plates are bonded together via the interlayer.

In the laminated glass structure, the interlayer is composed of a single layer of a resin film, and the resin film preferably serves as the light emitting layer. Further, two or more layers of resin films may be provided in the interlayer, and at least one of the plurality of resin films may serve as the light emitting layer.

Further, the resin film serving as the light emitting layer does not necessarily constitute the interlayer, and may be provided, for example, on the surface of any one of the transparent plates that is opposite to the surface on the interlayer side, in the laminated glass structure. Further, in the case when one transparent plate is provided in the window glass for a vehicle, the resin film may be provided on any one of the surfaces of the single layer transparent plate.

In the case when the resin film serving as the light emitting layer is provided on the opposite surface in the laminated glass structure or any one surface of the single layer transparent plate, a sheet-shaped member having the light emitting layer (resin film) may be bonded to the surface of the single layer glass or the laminated glass structure via an adhesive, a pressure-sensitive adhesive, or the like. Thus, the light emitting layer can be provided on the window glass for a vehicle by so-called post bonding by attaching such a sheet-shaped member onto existing window glass.

The resin film serving as the light emitting layer contains a resin and a fluorescent material, in which the fluorescent material is generally dispersed in the resin. The fluorescent material may be dispersed throughout the light emitting layer. The resin used in the resin film is preferably a thermoplastic resin. Use of the thermoplastic resin makes it easy for the resin film to exert functions as an adhesive layer and facilitates bonding to the transparent plates or the like in the case of constituting an interlayer, as described above.

In the case when the resin film contains a fluorescent material, the content of the fluorescent material is preferably 0.001 parts by mass or more, more preferably 0.05 parts by mass or more, further preferably 0.1 parts by mass or more, based on 100 parts by mass of the resin. Adjusting the content of the fluorescent material to such a lower limit or more enables the window glass for a vehicle to sufficiently emit light. Further, the content of the fluorescent material is preferably 10 parts by mass or less, more preferably 3 parts by mass or less, further preferably 1.5 parts by mass or less. Adjusting the content to such an upper limit or less facilitates ensuring the transparency of the window glass for a vehicle.

The thickness of the resin film is not specifically limited, but is, for example, 0.1 to 2 mm, preferably 0.2 to 1 mm. Adjusting the thickness of the resin film to such a range enables sufficient light emission brightness to be ensured without impairing the transparency of the window glass for a vehicle.

Further, the thickness of the interlayer is not specifically limited, but is, for example, 0.1 to 3 mm, preferably 0.2 to 2 mm.

As described above, the resin used in the resin film is preferably a thermoplastic resin. Further, the thermoplastic resin to be used in the resin film is not specifically limited, but examples thereof include a polyvinyl acetal resin, an ethylene-vinyl acetate copolymer resin, an ionomer resin, a polyurethane resin, and a thermoplastic elastomer. Use of such a resin facilitates ensuring the adhesiveness of the resin film to the transparent plates and is thus particularly suitable in the case when the resin film constitutes an interlayer.

In the resin film, one of such thermoplastic resins may be used singly or two or more of them may be used in combination. Among these, a polyvinyl acetal resin is particularly suitable in that excellent adhesiveness to inorganic glass is exerted in the case when a plasticizer is contained in the resin film.

In the case when the resin film contains a thermoplastic resin, the resin film may further contain a plasticizer. The resin film is made flexible by containing a plasticizer therein, as a result of which, the window glass for a vehicle is made flexible. Further, the adhesiveness to the transparent plates can be enhanced, particularly in the case when the transparent plates are inorganic glass. In the case of using a polyvinyl acetal resin as the thermoplastic resin, the plasticizer is particularly effective when contained in the layer.

Examples of the plasticizer include organic ester plasticizers such as monobasic organic acid esters and polybasic organic acid esters, and phosphoric acid plasticizers such as organic phosphoric acid plasticizers and organic phosphorous acid plasticizers. Among these, organic ester plasticizers are preferable, and triethylene glycol-di-2-ethyl hexanoate (3GO) is particularly suitable.

The content of the plasticizer is not specifically limited, but the lower limit is preferably 30 parts by mass, and the upper limit is preferably 70 parts by mass, relative to 100 parts by mass of the thermoplastic resin. In the case when the content of the plasticizer is 30 parts by mass or more, the window glass for a vehicle is made appropriately flexible, so that the handleability is made good. Further, when the content of the plasticizer is 70 parts by mass or less, separation of the plasticizer from the resin film is prevented. The lower limit of the content of the plasticizer is more preferably 35 parts by mass, and the upper limit is more preferably 63 parts by mass.

Further, in the case when the resin film of the present invention comprises a thermoplastic resin, the thermoplastic resin, or the thermoplastic resin and the plasticizer serve as main components, and the total amount of the thermoplastic resin and the plasticizer is generally 70 mass % or more, preferably 80 mass % or more, further preferably 90 mass % or more, based on the total amount of the resin film.

Further, the resin film may contain additives such as antioxidants, adhesion modifiers, ultraviolet absorbers, infrared absorbers, and antistatic agents, as required.

(Transparent Plate)

As the transparent plate, those which can be used for window glass for a vehicle can be used without specific limitation, and inorganic glass and organic glass can be used. The inorganic glass is not specifically limited, but examples thereof include clear glass, float plate glass, polished plate glass, figured glass, net-wired plate glass, line-wired plate glass, and green glass.

Further, as the organic glass, those generally called resin glass are used without specific limitation, but examples thereof include transparent organic glass composed of resins such as polycarbonates, acrylic resins, acrylic copolymer resins, and polyesters.

In the case when the window glass for a vehicle has two or more transparent plates, the plurality of transparent plates may be composed of the same material as each other and may be composed of different materials. For example, in the case when two transparent plates are included, one may be inorganic glass and the other may be organic glass. However, in the case when a plurality of transparent plates are included, the plurality of transparent plates are preferably all inorganic glass or all organic glass.

Further, the thickness of each transparent plate is not specifically limited but is, for example, about 0.1 to 15 mm, preferably 0.5 to 5 mm. In the case when the window glass for a vehicle has a plurality of transparent plates, the thickness of each transparent plate may be the same or different.

As described above, in the window glass for a vehicle, the transparent plate may serve as the light emitting layer that emits visible light. In the case when the transparent plate serves as the light emitting layer, the transparent plate itself contains the fluorescent material. In such a case, the fluorescent material may be dispersed in the inorganic material constituting inorganic glass or the organic material (resin) constituting organic glass of the transparent plate. Here, the fluorescent material may be dispersed throughout the transparent plate. In the case when the transparent plate itself contains the fluorescent material, the content of the fluorescent material is preferably 0.001 parts by mass or more, more preferably 0.05 parts by mass or more, further preferably 0.1 parts by mass or more, relative to 100 parts by mass of the inorganic material constituting inorganic glass or 100 parts by mass of the resin constituting organic glass. Adjusting the content of the fluorescent material to such a lower limit or more enables the window glass for a vehicle to sufficiently emit light. Further, the content of the fluorescent material is preferably 10 parts by mass or less, more preferably 3 parts by mass or less, further preferably 1.5 parts by mass or less. Adjusting the content of the inorganic material to such an upper limit or less prevents the transparency of the window glass for a vehicle from being impaired by the fluorescent material.

In the case when the transparent plate contains the fluorescent material to serve as the light emitting layer, the window glass for a vehicle may have the laminated glass structure as described above or the transparent plate may be composed of a single layer. In the case of having the laminated glass structure, at least one transparent plate may serve as the light emitting layer.

The window glass for a vehicle may transmit visible light or may be configured not to transmit visible light, but preferably transmits visible light. To transmit visible light means, for example, that the visible light transmittance is 30% or more, preferably 50% or more.

In the case when the window glass for a vehicle is used, for example, as windshield or front side glass for a car, the visible light transmittance is preferably 70% or more, more preferably 75% or more, further preferably 80% or more, for enhancing the transparency of the window glass for a vehicle and ensuring the car safety. Further, the upper limit of the visible light transmittance is not specifically limited and is preferably as high as possible, but is practically preferably 99% or less, more preferably 95% or less. The visible light transmittance means an average of visible light transmittance at 400 to 780 nm and can be measured, for example, using an ultraviolet-visible-infrared spectrophotometer (UH4150, manufactured by Hitachi High-Technologies Corporation) according to JIS R3212.

Further, the window glass for a vehicle emits visible light due to the excitation light incident from the light source, as described above. The visible light is generally light having a wavelength of 400 to 780 nm. Further, the window glass for a vehicle may emit blue, green, red, and other light or may emit white light by mixing light of two or more colors. In the case of mixing light of two or more colors, for example, two or more light emitting layers may be provided, so that each layer emits light of different color for mixing colors, or one light emitting layer may contain two or more fluorescent materials.

The window glass for a vehicle preferably emits red light to alert the driver of the own car. Specifically, the window glass for a vehicle may emit light preferably having the maximum emission wavelength at 590 to 780 nm, more preferably 600 to 750 nm, further preferably 620 to 700 nm. In order to emit red light, a lanthanoid complex having a ligand containing a halogen atom may be, for example, used as the fluorescent material, and europium may be used as the lanthanoid.

Further, the window glass for a vehicle may be provided with a reflective film that reflects visible light or excitation light. The reflective film is preferably provided on the outer side of the vehicle, compared to the light emitting layer (that is, outward of the vehicle). The reflective film may reflect visible light or may reflect excitation light. As the reflective film, a known film such as a metal film, a visible light reflecting film, or the like may be used. Since the reflective film reflects visible light or the like emitted by the light emitting layer, providing the reflective film can further enhance the emission intensity of the window glass for a vehicle.

The reflective film is preferably provided when the window glass for a vehicle is side glass or rear glass in order not to obstruct the view of the driver.

REFERENCE SIGNS LIST

10: Windshield (window glass for a vehicle)
10A, 10B: Transparent plate
10C: Interlayer
10E: End part
10X: Outer peripheral surface
11: Light source
11A: Output end
12: Front side glass (window glass for a vehicle)
12E: End part
13: Delta window glass (window glass for a vehicle)
15: Controller
16: Detector
21, 22: Pillar
23: Roof
24: Light guide
24A: End part
24X: Side surface

The invention claimed is:

1. A window glass for a vehicle, the window glass comprising two transparent plates and an interlayer provided between the two transparent plates,
    wherein the two transparent plates are bonded together via the interlayer,
    wherein the interlayer comprises a resin film as a light emitting layer,
    wherein the resin film comprises a resin and a fluorescent material that is dispersed in the resin,
    wherein the window glass emits visible light through incident radiation of excitation light irradiated from a light source,
    wherein an end part of the window glass is allowed to emit the light through irradiation with the excitation light,
    wherein the end part is allowed to emit light when it is detected that at least any one of a person and an object is approaching the vehicle,
    wherein the mode of light emission is changed depending on detected contents, and
    wherein
        at least one of light emitting area and light emitting position is changed depending on a distance from an approaching the person or the object,
        or
        light emitting position is changed as follows:
            when a detector detects the person or the object approaching from a left side of the vehicle, the end part on the left side of a windshield that is composed of the window glass is allowed to emit the light, and
            when a detector detects the person or the object approaching from a right side of the vehicle, the end part on the right side of the windshield is allowed to emit the light.

2. The window glass for a vehicle according to claim 1, wherein the window glass for a vehicle is any one of windshield and side glass for a car.

3. A warning display method utilizing a window glass for a vehicle,
    wherein the window glass comprises two transparent plates and an interlayer provided between the two transparent plates,
    wherein the two transparent plates are bonded together via the interlayer,
    wherein the interlayer comprises a resin film as a light emitting layer,
    wherein the resin film comprises a resin and a fluorescent material that is dispersed in the resin,
    wherein the window glass emits visible light through incident radiation of excitation light irradiated from a light source,
    wherein an end part of the window glass is allowed to emit the light through irradiation with the excitation light to alert a passenger,
    wherein the end part is allowed to emit light when it is detected that at least any one of a person and an object is approaching the vehicle,
    wherein the mode of light emission depending on the detected contents, and
    wherein
        at least one of light emitting area, and light emitting position is changed depending on a distance from an approaching the person or the object,
        or
        light emitting position is changed as follows:
            when a detector detects the person or the object approaching from a left side of the vehicle, the end part on the left side of a windshield that is composed of the window glass is allowed to emit the light, and
            when a detector detects the person or the object approaching from a right side of the vehicle, the end part on the right side of the windshield is allowed to emit the light.

4. The warning display method according to claim 3, wherein the window glass for a vehicle is any one of windshield and side glass for a car.

5. The window glass for a vehicle according to claim 1, wherein the window glass is a windshield.

6. The window glass for a vehicle according to claim 1, wherein the window glass is a windshield and at least one of a front side glass and a delta window glass, and wherein an end part of the windshield and at least one of the delta window glass and an end part on a front side of the front side glass are allowed to emit light through irradiation with the excitation light.

7. The window glass for a vehicle according to claim 1, wherein the excitation light is from a light source unit comprising a MEMS mirror and the light source, and the window glass is irradiated with the excitation light from the light source via the MEMS mirror.

8. The window glass for a vehicle according to claim 1, wherein a light guide extends along an outer peripheral surface of the window glass, the light guide is a side emission type of optical fiber, and the excitation light enters the window glass through the light guide and the outer peripheral surface.

9. The window glass for a vehicle according to claim 1, wherein the excitation light is allowed to enter the window glass from an outer peripheral surface thereof such that the excitation light does not penetrate into the center of window glass, thereby allowing only the end part of the window glass to emit the light.

10. The warning display method according to claim 3, wherein the window glass is a windshield.

11. The warning display method according to claim 3, wherein the window glass is a windshield and at least one of a front side glass and a delta window glass, and wherein an end part of the windshield and at least one of the delta window glass and an end part on a front side of the front side glass are allowed to emit light through irradiation with the excitation light.

12. The warning display method according to claim 3, wherein the excitation light is from a light source unit comprising a MEMS mirror and the light source, and the window glass is irradiated with the excitation light from the light source via the MEMS mirror.

13. The warning display method according to claim 3, wherein a light guide extends along an outer peripheral surface of the window glass, the light guide is a side emission type of optical fiber, and the excitation light enters the window glass through the light guide and the outer peripheral surface.

14. The warning display method according to claim 3, wherein the excitation light is allowed to enter the window glass from an outer peripheral surface thereof such that the excitation light does not penetrate into the center of window glass, thereby allowing only the end part of the window glass to emit the light.

\* \* \* \* \*